(12) United States Patent
Imahigashi et al.

(10) Patent No.: US 11,367,995 B2
(45) Date of Patent: Jun. 21, 2022

(54) ELECTRONIC DEVICE

(71) Applicant: SONY SEMICONDUCTOR SOLUTIONS CORPORATION, Kanagawa (JP)

(72) Inventors: Takashi Imahigashi, Kumamoto (JP); Kaoru Tanaka, Kumamoto (JP); Masashi Miyazaki, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/387,851

(22) Filed: Jul. 28, 2021

(65) Prior Publication Data

US 2021/0376564 A1 Dec. 2, 2021

Related U.S. Application Data

(63) Continuation of application No. PCT/JP2020/003917, filed on Feb. 3, 2020.

(30) Foreign Application Priority Data

Feb. 4, 2019 (JP) .............................. JP2019-018088
Sep. 25, 2019 (JP) .............................. JP2019-174039

(51) Int. Cl.
| | | |
|---|---|---|
| *H01S 5/0236* | (2021.01) | |
| *H01S 5/02355* | (2021.01) | |
| *H01S 5/042* | (2006.01) | |
| *H01S 5/0234* | (2021.01) | |
| *H01S 5/02* | (2006.01) | |
| *H01S 5/42* | (2006.01) | |
| *G01B 11/25* | (2006.01) | |
| *G01S 7/481* | (2006.01) | |

(52) U.S. Cl.
CPC .......... *H01S 5/02355* (2021.01); *H01S 5/021* (2013.01); *H01S 5/0234* (2021.01); *H01S 5/04257* (2019.08); *H01S 5/423* (2013.01); *G01B 11/25* (2013.01); *G01S 7/4815* (2013.01)

(58) Field of Classification Search
CPC .... H01S 5/02355; H01S 5/021; H01S 5/0234; H01S 5/04257; H01S 5/423
See application file for complete search history.

(56) References Cited

U.S. PATENT DOCUMENTS

| 4,855,102 A | 8/1989 | Okada et al. |
| 6,967,982 B2 | 11/2005 | Wakisaka et al. |

(Continued)

FOREIGN PATENT DOCUMENTS

| JP | 3827569 | 9/2006 |
| JP | 2011-077308 | 4/2011 |

OTHER PUBLICATIONS

International Search Report and Written Opinion for International (PCT) Patent Application No. PCT/JP2020/003917, dated Jun. 30, 2020, 23 pages.

*Primary Examiner* — Yuanda Zhang
(74) *Attorney, Agent, or Firm* — Sheridan Ross P.C.

(57) ABSTRACT

An electronic device according to a present disclosure includes a semiconductor substrate, a chip, and a connection part. The chip has a different thermal expansion rate from that of the semiconductor substrate. The connection part includes a porous metal layer for connecting connection pads that are arranged on opposing principle surfaces of the semiconductor substrate and the chip.

26 Claims, 10 Drawing Sheets

(56) References Cited

U.S. PATENT DOCUMENTS

| | | |
|---|---|---|
| 7,116,854 B2 | 10/2006 | Kaneko et al. |
| 7,393,771 B2 | 7/2008 | Hozoji et al. |
| 2005/0169571 A1 | 8/2005 | Kaneko et al. |
| 2006/0246627 A1* | 11/2006 | Feustel ................ H01L 21/563 438/118 |
| 2006/0267218 A1* | 11/2006 | Hozoji .................. H01L 24/84 257/782 |
| 2007/0216012 A1 | 9/2007 | Hozoji et al. |
| 2011/0147927 A1* | 6/2011 | Hagihara ............... H01L 24/05 257/737 |
| 2013/0285261 A1* | 10/2013 | Tan ...................... H01S 5/0237 257/777 |
| 2015/0041974 A1 | 2/2015 | Kobayashi et al. |
| 2017/0051884 A1 | 2/2017 | Raring et al. |
| 2020/0014169 A1* | 1/2020 | Yu .......................... H01S 5/423 |

* cited by examiner

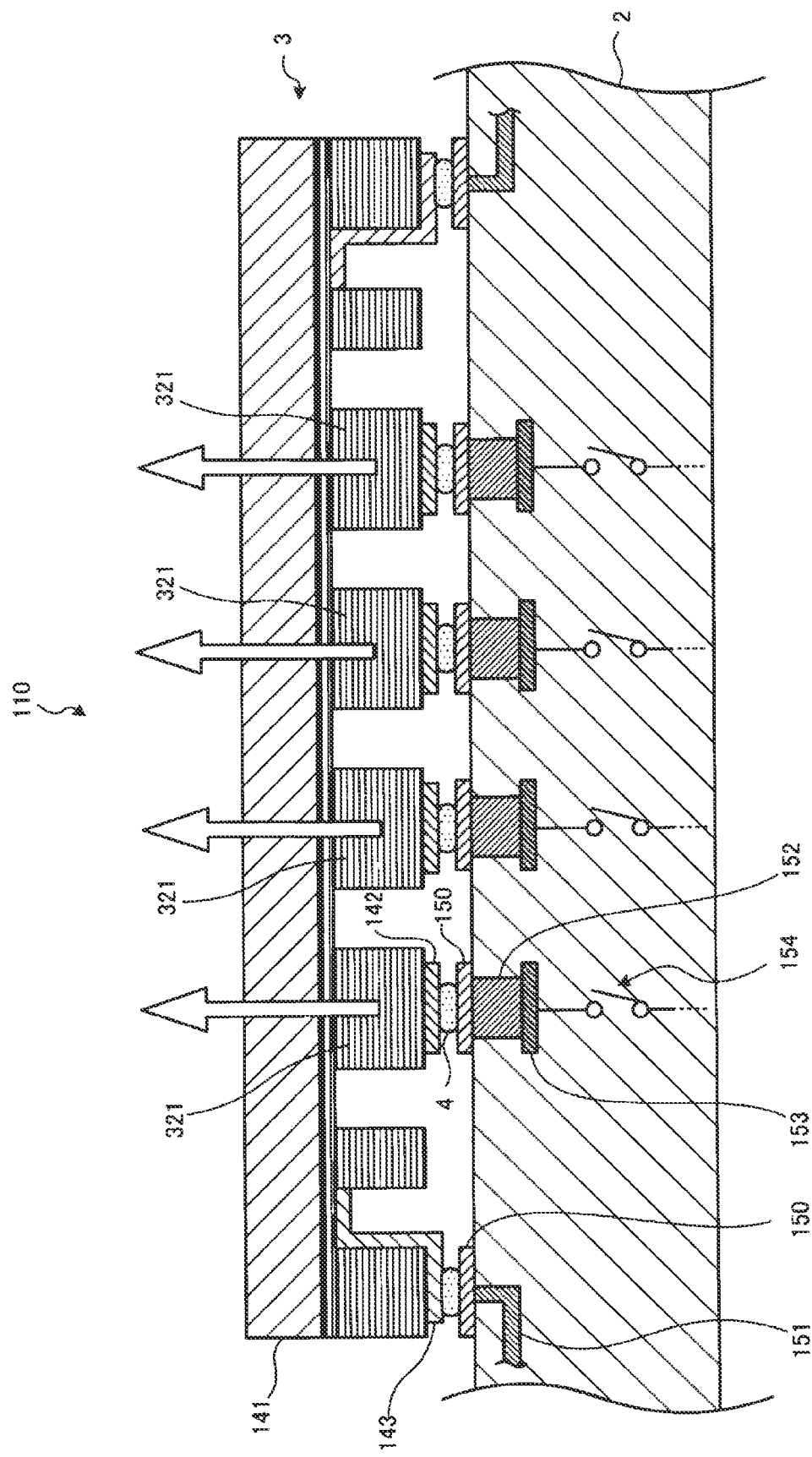

ELECTRONIC DEVICE

CROSS-REFERENCE TO RELATED APPLICATION

The present application is a continuation of and claims priority to PCT Application No. PCT/JP2020/003917 having an international filing date of Feb. 3, 2020, which designated the United States, which PCT application claimed the benefit of Japanese Patent Application No. 2019-018088 filed in Japan on Feb. 4, 2019; and Japanese Patent Application No. 2019-174039 filed in Japan on Sep. 25, 2019.

BACKGROUND OF THE INVENTION

1. Field of the Invention

The present disclosure relates to an electronic device.

2. Description of the Related Art

As a technology for mounting an electronic component chip on a semiconductor substrate, for example, flip chip mounting of bringing a metal bump, which is arranged in a protruding manner on an upper surface of the semiconductor substrate, and a connection pad, which is arranged on a lower surface of the chip, into pressure contact with each other and simultaneously applying heat to thereby connect the metal bump and the chip has been known (for example, see Japanese Laid-open Patent Publication No. 2011-077308). As a material of the bump, in general, gold, copper, solder, and the like in bulk states are used.

However, if gold or copper in a bulk state is used as the material of the bump and a chip having a different thermal expansion rate from that of a semiconductor substrate is to be mounted on the semiconductor substrate by the flip chip mounting, it is necessary to connect the bump at high temperature and high pressure, so that the chip is damaged and reliability of the electronic device is reduced.

Further, if solder is used as the material of the bump, it is possible to connect the semiconductor substrate and the chip at relatively low temperature and low pressure, but a connection strength is lower than that of a bump made of gold or copper; therefore, if the semiconductor substrate and the chip have different thermal expansion rates, the reliability is reduced due to the connection strength.

SUMMARY OF THE INVENTION

Various aspects and features of the invention are defined in the appended claims. An electronic device according to a present disclosure includes a semiconductor substrate, a chip, and a connection part. The chip has a different thermal expansion rate from that of the semiconductor substrate. The connection part includes a porous metal layer for connecting connection pads that are arranged on opposing principle surfaces of the semiconductor substrate and the chip.

BRIEF DESCRIPTION OF THE DRAWINGS

The above and other objects, features, advantages and technical and industrial significance of this invention will be better understood by reading the following detailed description, when considered in connection with the accompanying drawings:

FIG. 8 is a diagram for explaining a cross section structure of a light source apparatus according to the present disclosure;

DETAILED DESCRIPTION OF THE PREFERRED EMBODIMENTS

Embodiments of the present disclosure will be described in detail below based on the drawings. In each of the embodiments below, the same components are denoted by the same reference symbols and indicated by the same hatching, and the same explanation will not be repeated.

1. Configuration of Cross Section of Electronic Device

Figure 1:
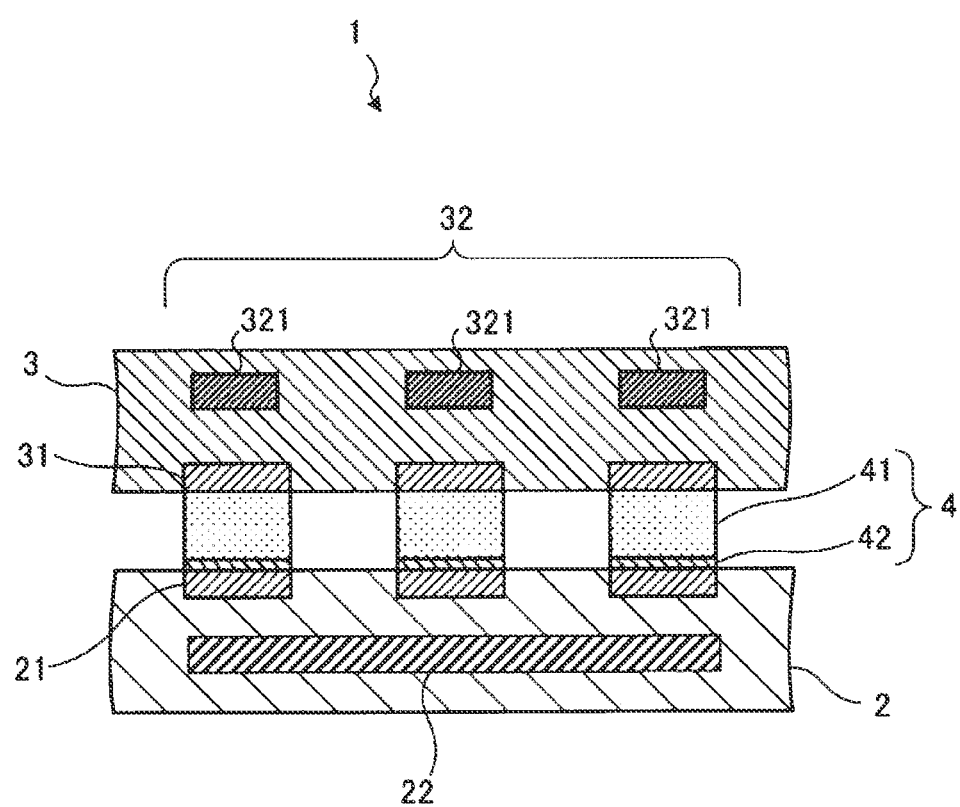
FIG. 1 is a diagram for explaining a cross section of an electronic device according to a present disclosure.

As illustrated in FIG. 1, an electronic device 1 according to the present disclosure includes a semiconductor substrate 2, a chip 3, and connection parts (for example, hereinafter, described as bumps 4) for connecting connection pads 21 and 31 that are arranged on opposing principle surfaces of the semiconductor substrate 2 and the chip 3. In the following, exemplary details with respect to the semiconductor substrate 2, the chip 3, and the connecting connection pads 21 and 31 will be given. However, other embodiments may include other exemplary details.

The chip 3 may be, for example, a semiconductor laser and may include the connection pads 31, light emitting parts 32 of the semiconductor laser, and the like inside a base material made of, for example, a semiconductor material or a semiconductor compound material, for example gallium arsenide (GaAs). The light emitting section 32 may include a plurality of light emitting elements 321, each of which emits laser light. For example, the plurality of light emitting elements 321 may be two-dimensionally arranged. The electronic components formed in the base material of the chip 3 may be arbitrary electronic components other than the light emitting parts 32 of the semiconductor laser. Further, the base material of the chip 3 may be a semi-insulating base material made of, for example, indium phosphide (InP) or the like.

The semiconductor substrate 2 may be, for example, a silicon (Si) substrate, and a drive circuit 22 that drives the semiconductor laser may be formed inside the semiconductor substrate 2. The electronic circuit formed inside the semiconductor substrate 2 may be an arbitrary electronic circuit other than the drive circuit 22 of the semiconductor laser.

The electronic device 1 may be configured such that the chip 3 is mounted on the semiconductor substrate 2 by flip chip mounting, and the bumps 4 electrically connect the drive circuit 22 inside the semiconductor substrate 2 and the chip 3 as the semiconductor laser.

In general flip chip mounting, a chip is mounted on a semiconductor substrate by bringing a bulk-state metal bump, such as gold (Au), copper (Cu), or solder, arranged on an opposing principle surface of the semiconductor substrate or the chip into pressure contact with the semiconductor substrate or the chip and applying heat simultaneously.

However, when a difference between thermal expansion rates of the semiconductor substrate and the chip is, for example, 0.1 ppm/° C. or greater, and if Au, Cu, solder, or the like in a bulk state is used as the material of the bump, the following problems may occur.

For example, if Au in a bulk state is used as the material of the bump, to stably connect the semiconductor substrate and the chip having different thermal expansion rates using the bump, it is necessary to apply heat at high temperature of 300° C. or higher and apply high pressure of 100 MPa or higher between the semiconductor substrate and the chip.

Further, if Cu in a bulk state is used as the material of the bump, it is necessary to apply heat at temperature of 380° C. or higher. In this manner, when Au or Cu in a bulk state is used as the material of the bump, it is necessary to connect the bump at high temperature and high pressure, and the high temperature and the high pressure may damage the chip, so that the reliability of the electronic device may be reduced.

In contrast, if solder is used as the material of the bump, it is possible to connect the bump at lower temperature and lower pressure as compared to using Au and Cu; however, solder has lower heat resistance and connection strength than those of Au and Cu. Therefore, as for the bump made of solder, for example, if the chip expands due to heat generated by the electronic component, such as the semiconductor laser, mounted on the chip, an open fault occurs due to a difference between the thermal expansion rates of the semiconductor substrate and the chip, so that the reliability of the electronic device may be reduced.

As described above, the semiconductor substrate 2 according to the present disclosure may be the Si substrate having a thermal expansion rate of 5.7 ppm/° C. In contrast, the base material of the chip 3 according to the present disclosure may be GaAs having a thermal expansion rate of 2.6 ppm/° C.

Therefore, in the electronic device 1, a difference between the thermal expansion rates of the semiconductor substrate 2 and the chip 3 may be far greater than 0.1 ppm/° C. Therefore, if the material of the bump is Au, Cu, or solder in a bulk state in the electronic device 1, the above-described problems may occur and the reliability may be reduced.

To cope with this, the bumps 4 of the electronic device 1 may include, for example, porous metal layers 41 made of, for example, Au. The porous metal layers 41 may include Au particles with particle diameters of 0.005 micrometer (μm) to 1.003 μm. Meanwhile, a component of the porous metal layers 41 may be, for example, Cu, silver (Ag), or platinum (Pt).

The porous metal layers 41 may include the metal particles with the particle diameters of 0.005 μm to 1.0 μm. This may allow to bond metals at lower temperature than a melting point of a bulk-state metal due to a size effect of the particle diameters. For example, the porous metal layers 41 are able to connect the semiconductor substrate 2 and the chip 3 at about 100° C. when composed of Au, at about 250° C. when composed of Ag, and at about 150° C. when composed of Cu. Therefore, the electronic device 1 is able to reduce damage of the chip 3 due to heat and improve the reliability.

For example, a height ratio between the porous metal layer 41 and the bumps 4, e.g. a ratio between a thickness or vertical extension of the porous metal layer 41 and a thickness or vertical extension of the bumps 4 may be equal to or larger than 90%, or equal to or larger than 95%. The vertical extension is an extension along a vertical direction which may be a direction of stacking of the semiconductor substrate 2 and the chip 3, e.g. a direction perpendicular to the principle surface of the semiconductor substrate 2 or the chip 3. In addition to the porous metal layer 41, the bumps 4 may include one or metal layers being non-porous or having a smaller porosity, e.g. volume fraction of pores, than the porous metal layer 41. Examples of metal layers are described further below with respect to the metal films 42, 43, for example. Further, the porous metal layers 41 may have elasticity and are elastically deformed even when, for example, the chip 3 expands at a different thermal expansion rate from that of the semiconductor substrate 2 due to heat generated by the semiconductor laser, so that the above height ratio between the porous metal layer 41 and the bumps 4 allows for preventing occurrence of an open fault. Therefore, the electronic device 1 having the above height ratio between the porous metal layer 41 and the bumps 4 is able to improve the reliability as compared to a case where, for example, a bump made of solder is used.

The electronic device 1 as described above may be manufactured by depositing the chip 3 on the semiconductor substrate 2 having an upper surface on which the bumps 4 are arranged, connecting the porous metal layers 41 of the bumps 4 to the connection pads 31 without melting the porous metal layers 41, and mounting the chip 3 on the semiconductor substrate 2, for example, by flip chip mounting.

Further, the electronic device 1 may be manufactured by depositing, on the semiconductor substrate 2, the chip 3 having a lower surface on which bumps including the porous metal layers 41 are arranged, connecting the porous metal layers 41 of the bumps to the connection pads 21 without melting the porous metal layers 41, and mounting the chip 3 on the semiconductor substrate 2, for example, by flip chip mounting. Meanwhile, the bumps may be arranged on each of the semiconductor substrate 2 and the chip 3 before deposition.

If the bumps 4 are arranged on the semiconductor substrate 2 side, metal films 42 may be arranged between the porous metal layers 41 and the connection pads 21 on the semiconductor substrate 2 side. Further, if the bumps are arranged on the chip 3 side, metal films may be arranged between the porous metal layers 41 and the connection pads 31 on the chip 3 side.

In the present disclosure, by setting a ratio of film thicknesses of the metal films 42 to thicknesses of the bumps 4 in a direction perpendicular to the principle surface of the semiconductor substrate 2 to 10% or smaller, fine pitch can be realized such that a pitch between the bumps 4 is set to be 20 μm or smaller. The fine pitch will be described below in combination with a process of forming the bumps 4.

2. Process of Forming Bumps

The process of forming the bumps according to the present disclosure will be described below with reference to FIG. 2A to FIG. 3D. FIG. 2A to FIG. 2D are diagrams for explaining the process of forming the bumps 4 on the semiconductor substrate 2 according to examples of the present disclosure. FIG. 3A to FIG. 3D are diagrams for explaining a process of forming bumps 4a (see FIG. 3D) on the chip 3 according to the present disclosure.

Figure 2A:
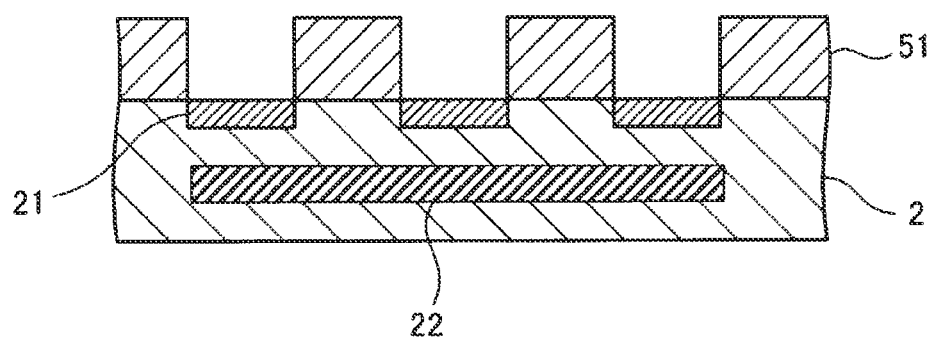
FIG. 2A is a diagram for explaining a process of forming bumps on a semiconductor substrate according to the present disclosure.

As illustrated in FIG. 2A, when the bumps 4 are to be formed on the semiconductor substrate 2, first, a photoresist layer 51 may be formed on a surface where the connection pads 21 are arranged on the semiconductor substrate 2. Thereafter, through holes may be formed using a photolithography technique at positions at which the bumps 4 are to be formed on the photoresist layer 51, so that surfaces of the connection pads 21 are exposed.

At this time, the through holes may be formed such that an interval between centers of the adjacent through holes is set to be, for example, 20 μm (20-μm pitch). The through holes may be filled with paste 40 including metal particles as a material of the porous metal layers 41 in a subsequent process; however, due to a fine structure using the exemplary 20-μm pitch, if the through holes are filled with the paste 40 in this state, the fine structure may be damaged and collapsed.

Figure 2B:
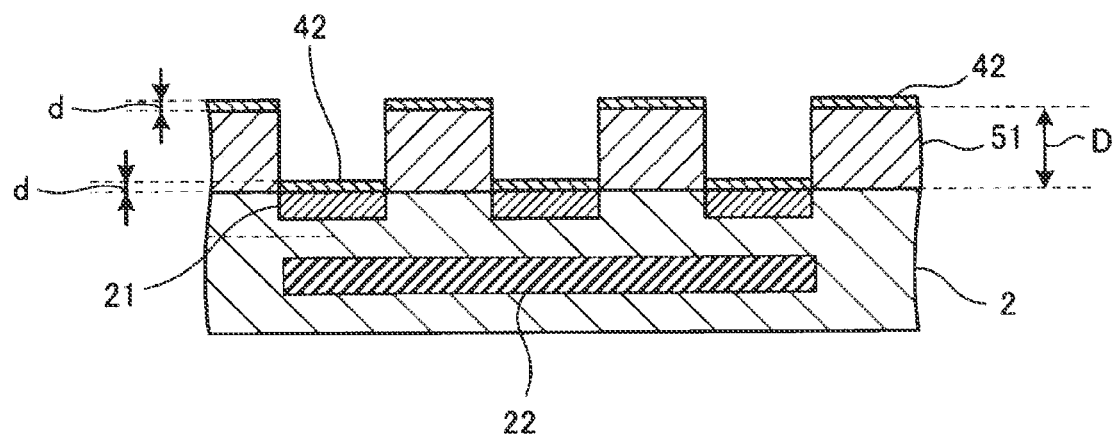
FIG. 2B is a diagram for explaining the process of forming the bumps on the semiconductor substrate according to the present disclosure.

Therefore, as illustrated in FIG. 2B, the metal films 42 may be formed by, for example, sputtering, on upper surfaces of the photoresist layer 51 and the connection pads 21. As a material of the metal films 42, a metal having the same component as the metal particles included in the paste 40 that is to be poured into the through holes may be selected. In this example, the metal films 42 made of Au are formed.

Accordingly, the surface of the photoresist layer 51 may be coated with the metal films 42 and become hardened, so that when the through holes are filled with the paste 40 including the metal particles, it is possible to prevent the fine structure from collapsing.

Further, if the film thicknesses of the metal films 42 formed at this time are too thick, openings of the through holes may narrow down and it becomes difficult to fill the through holes with the paste 40 including the metal particles. Therefore, in this example, the thin metal films 42 are formed such that a ratio of the film thicknesses of the metal films 42 to depths D of the through holes, in other words, the thicknesses of the to-be-formed bumps 4 in the direction perpendicular to the principle surface of the semiconductor substrate 2 (depths D of the bumps 4) is set to be 10% or smaller.

For example, when the bumps 4 with heights of 10 μm are to be formed at a 20-μm pitch, the film thicknesses of the metal films 42 are set to 0.2 μm. With this configuration, it is possible to prevent the openings of the through holes from narrowing down even when the metal films 42 are formed, so that it is possible to fully fill the thorough holes with the paste 40 including the metal particles in a subsequent process.

Figure 2C:
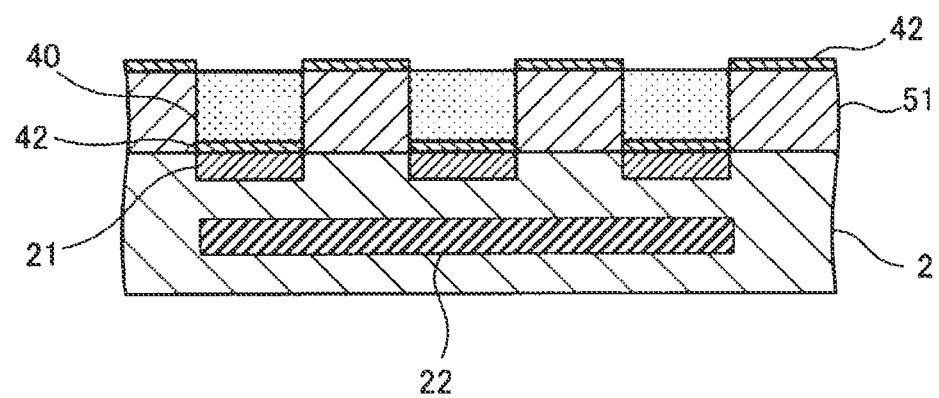
FIG. 2C is a diagram for explaining the process of forming the bumps on the semiconductor substrate according to the present disclosure.

Subsequently, as illustrated in FIG. 2C, the through holes formed on the photoresist layer 51 may be filled with the paste 40. The paste 40 may have a purity of 99.9 weight percent or higher and may include particles, for example Au particles, with particle diameters of 0.005 μm to 1.0 μm, for example. As a method of filling the through holes with the paste 40, an arbitrary method may be used, such as screen printing or a method of spreading the dropped paste 40 with a spatula, for example.

Figure 2D:
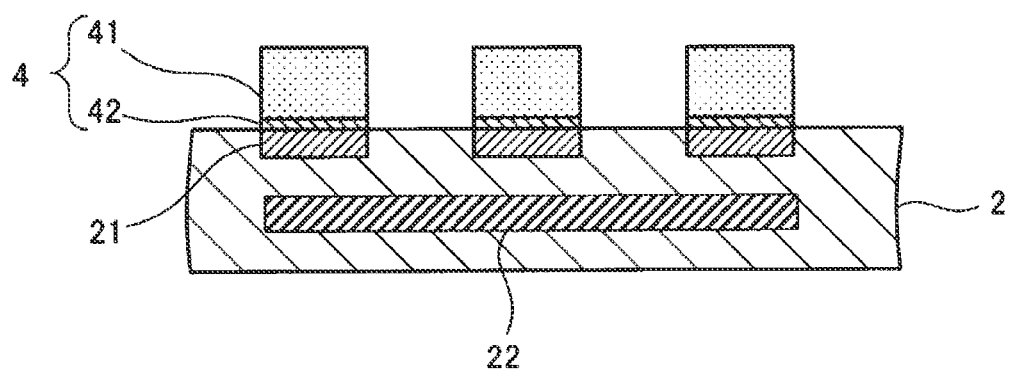
FIG. 2D is a diagram for explaining the process of forming the bumps on the semiconductor substrate according to the present disclosure.

Then, the paste 40 may be dried and sintered, and thereafter the photoresist layer 51 may be stripped using stripping solution or the like. Consequently, as illustrated in FIG. 2D, the bumps 4 having, for example, two-layer structures, in which the metal films 42 made of Au and the porous metal layers 41 including the Au particles with the particle diameters of 0.005 μm to 1.0 μm are sequentially deposited, are formed on the surfaces of the connection pads 21.

As described in the example above, the bumps 4 may include the metal films 42 such that the ratio of the film thicknesses to the heights of the bumps 4 is set to be 10% or smaller. The metal films 42 as described above are formed on the surfaces of the photoresist layer 51 and the connection pads 21 so as to prevent collapse of fine structures of the bumps 4 that are patterned on the photoresist layer 51. With this configuration, it is possible to realize fine pitch of the bumps 4 such that the pitch is set to be 20 μm or smaller.

Further, the metal films 42 may be formed on the surfaces of the connection pads 21 by sputtering, and therefore, even if the connection pads 21 are made of metal with a different component from that of the metal films 42, the metal films 42 can be firmly bonded with the connection pads 21.

The metal films 42 may be made of a component that is different metal from that of the porous metal layers 41 deposited on the surface, but when the metal films 42 are made of the same component as that of the porous metal layers 41, for example Au, the porous metal layers 41 can be bonded with the metal films 42 with a stronger bonding force than when the porous metal layers 41 are deposited on a metal film the component of which differs from that of the porous metal layers 41. It should be noted that when the bump 4 is made of a component other than Au (for example, Cu, Ag (silver), or Pt (platinum)), the metal films 42 can also be made of a component other than Au (for example, Cu, Ag (silver), or Pt (platinum)).

Figure 3A:
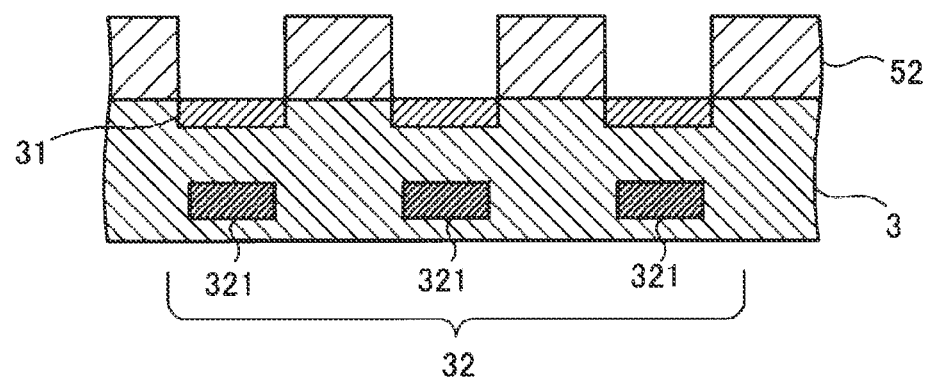
FIG. 3A is a diagram for explaining a process of forming bumps on a chip according to the present disclosure.
Figure 3B:
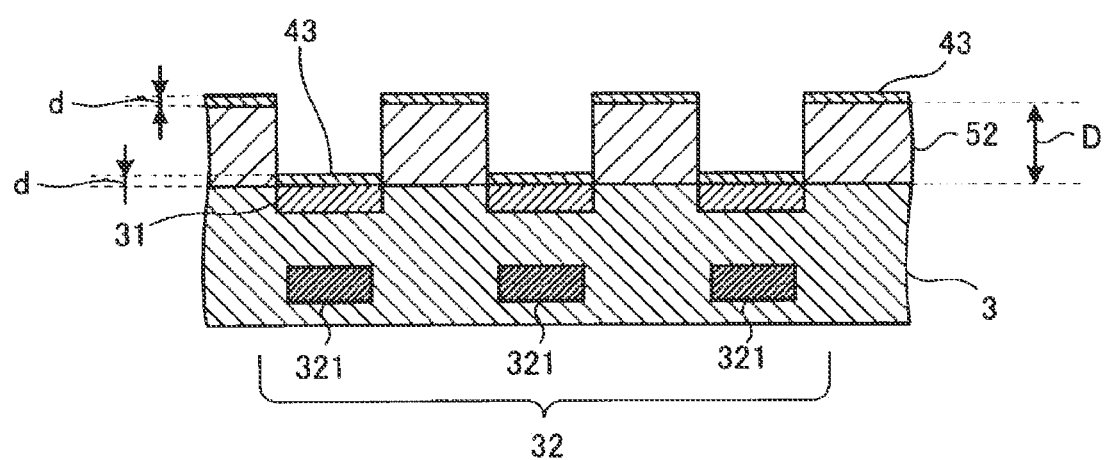
FIG. 3B is a diagram for explaining the process of forming the bumps on the chip according to the present disclosure.
Figure 3C:
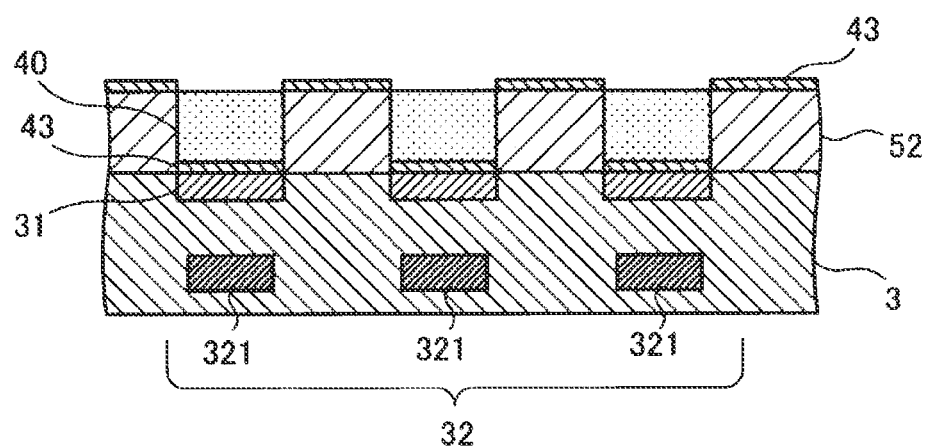
FIG. 3C is a diagram for explaining the process of forming the bumps on the chip according to the present disclosure.
Figure 3D:
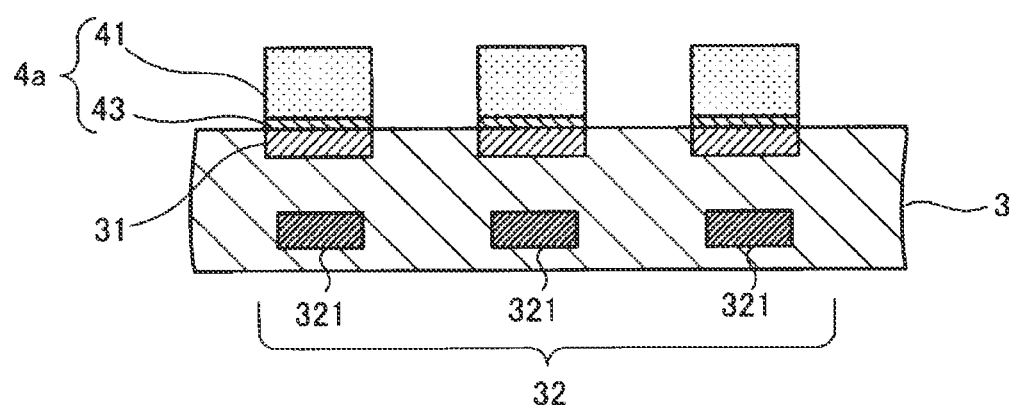
FIG. 3D is a diagram for explaining the process of forming the bumps on the chip according to the present disclosure.

The process of forming the bumps 4a as illustrated in FIG. 3D on the chip 3 will be described below. As illustrated in FIG. 3A, when the bumps 4a are to be formed on the chip 3, first, a photoresist layer 52 may be formed on a surface where the connection pads 31 are formed on the chip 3. Thereafter, through holes may be formed, for example, by using a photolithography technique at positions at which the bumps 4a are to be formed on the photoresist layer 52, so that surfaces of the connection pad 31 are exposed.

Thereafter, as illustrated in FIG. 3B, metal films 43 may be formed by, for example, sputtering, on upper surfaces of the photoresist layer 52 and the connection pads 31. As a material of the metal film 43, a material having the same component as the particles included in the paste 40 that is to be poured into the through holes is selected, for example Au.

Accordingly, the surface of the photoresist layer 52 may be coated with the metal films 43 and become hardened, so that when the through holes are filled with the paste 40 including the particles, for example Au particles, it is possible to prevent the fine structure from collapsing.

Further, even in this case, the thin metal films 43 may be formed such that a ratio of the film thicknesses of the metal films 43 to depths D of the through holes, in other words, thicknesses of the to-be-formed bumps 4a in a direction perpendicular to the principle surface of the chip 3 (depths D of the bumps 4a) is set to be 10% or smaller.

For example, similarly to the bumps 4 on the semiconductor substrate 2 side, when the bumps with heights of 10 μm are to be formed at a 20-μm pitch, the film thicknesses of the metal films 43 are set to 0.2 μm. With this configuration, it is possible to prevent the openings of the through holes from narrowing down even when the metal films 43 are formed, so that it is possible to fully fill the thorough holes with the paste 40 including the Au particles in a subsequent process.

Subsequently, as illustrated in FIG. 3C, the through holes formed on the photoresist layer 52 may be filled with the paste 40. The paste may have a purity of 99.9 weight percent or higher and may include particles, for example Au particles with particle diameters of 0.005 μm to 1.0 μm, for example.

Then, the paste 40 may be dried and sintered, and thereafter the photoresist layer 52 may be stripped using stripping solution or the like. Consequently, as illustrated in FIG. 3D, the bumps 4a having, for example, two-layer structures, in which the metal films 43 made of Au and the porous metal layers 41 including the Au particles with the particle diameters of 0.005 μm to 1.0 μm are sequentially deposited, are formed on the surfaces of the connection pads 31.

As described above, the bumps 4a may include the metal films 43 such that the ratio of the film thicknesses to the heights of the bumps 4a is set to be 10% or smaller. With this configuration, it is possible to realize fine pitch of the bumps 4a such that the pitch is set to be 20 μm or smaller, similarly to the bumps 4 on the semiconductor substrate 2 side.

Further, similarly to the bumps 4 on the semiconductor substrate 2 side, the bumps 4a are able to firmly bond the metal films 43 and the connection pads 31, so that it is possible to firmly bond the metal films 43 and the porous metal layers 41.

In the embodiment as described above, the cases are described in which the chip 3 on which the bumps 4a are not arranged is mounted on the semiconductor substrate 2 on which the bumps 4 are arranged and in which the chip 3 on which the bumps 4a are arranged is mounted on the semiconductor substrate 2 on which the bumps 4 are arranged, but these cases are described by way of example only.

The electronic device according to the present disclosure may be configured such that the chip 3 on which the bumps 4a are arranged is mounted on the semiconductor substrate 2 on which the bumps 4 are arranged. In this configuration, the metal films 42 and 43 may be formed such that a ratio of the film thicknesses to halves of thicknesses of laminated bodies of the bumps 4 and the bumps 4a serving as connection parts for connecting the semiconductor substrate 2 and the chip 3 in a direction perpendicular to the principle surfaces of the semiconductor substrate 2 and the chip 3 is set to be 10% or smaller, preferably less than 5%.

Further, in the embodiment as described above, the case has been described in which the base material of the chip 3 is a base material other than Si, but the base material of the chip 3 may be Si doped with impurities as long as a thermal expansion rate of the base material is different from that of the semiconductor substrate 2.

The above-described chip 3 including the light emitting section 32 of the semiconductor laser and the semiconductor substrate 2 including the drive circuit 22 of the semiconductor laser may be mounted on a distance measuring apparatus such as a ToF sensor and structured light, for example. The light emitting section 32 of the semiconductor laser that is mounted on a distance measuring apparatus functions as a light source of the ToF sensor or the structured light, for example.

Figure 4:
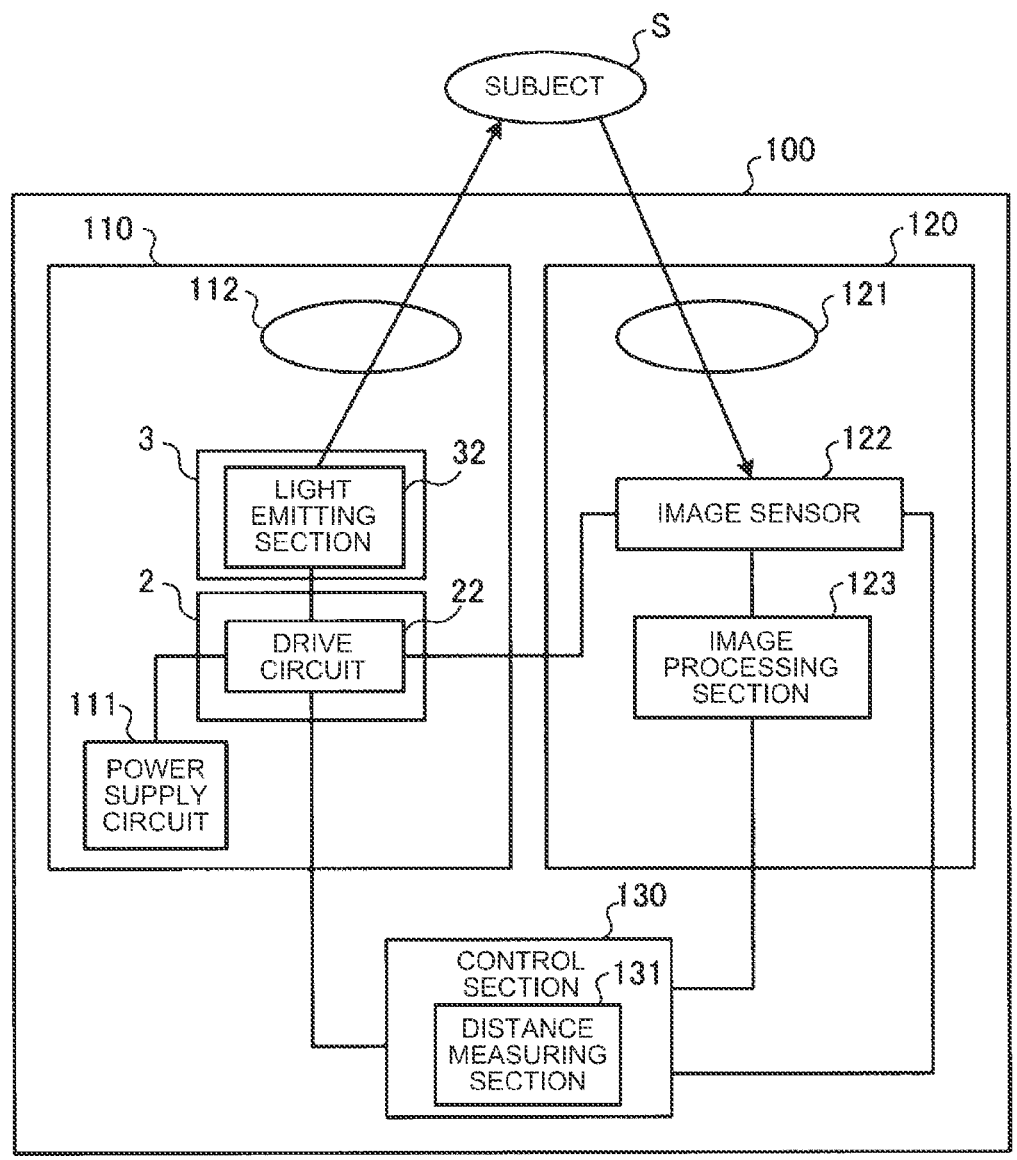
FIG. 4 is a block diagram illustrating an example of a configuration of a distance measuring apparatus according to the present disclosure.

Next, with reference to FIG. 4, a distance measuring apparatus having the electronic device 1 according to the embodiment mounted thereon will be described. FIG. 4 is a block diagram illustrating an example of a configuration of the distance measuring apparatus 100 according to the embodiment. As illustrated in FIG. 4, the distance measuring apparatus 100 may include a light source apparatus 110, an imaging apparatus 120, and a control section 130.

The light source apparatus 110 may include the chip 3 having the light emitting section 32 mounted thereon, the semiconductor substrate 2 having the drive circuit 22 mounted thereon, a power supply circuit 111, and a light emitting-side optical system 112. The imaging apparatus 120 may include an imaging-side optical system 121, an image sensor 122, and an image processing section 123.

The control section 130 may include a distance measuring section 131. The control section 130 can be included in the light source apparatus 110 or the imaging apparatus 120, or can be configured separately from the light source apparatus 110 or the imaging apparatus 120.

The light emitting section 32 may include the light emitting elements 321, for example two-dimensionally arrayed, each of which emits laser light (refer to FIG. 1). Each of the light emitting elements 321 may have a vertical cavity surface emitting laser (VCSEL) structure, for example.

The drive circuit 22 may include an electric circuit with which the light emitting section 32 is driven. The power supply circuit 111 generates power supply voltage of the drive circuit 22 from input voltage supplied by a battery (not illustrated) or the like, which is mounted on the distance measuring apparatus 100, for example. The drive circuit 22 drives the light emitting section 32 with the power supply voltage.

A subject S serving as a target of distance measurement is irradiated with light emitted from the light emitting section 32 via the light emitting-side optical system 112. Reflected light from the subject S irradiated with light as described above is incident on an imaging surface of the image sensor 122 via the imaging-side optical system 121.

An image sensor 7 may include an imaging element such as a charge coupled device (CCD) sensor and a complementary metal oxide semiconductor (CMOS) sensor, for example, and as described above, receives the reflected light from the subject S having light incident thereon via the imaging-side optical system 121 as described above, and converts the received light into electrical signals to be output.

The image sensor 122 performs various kinds of processing such as correlated double sampling (CDS) processing and automatic gain control (AGC) processing, for example, to electrical signals generated through photoelectric conversion on the received light, and further performs analog/digital (A/D) conversion thereto.

Then, the image sensor 122 outputs image signals serving as digital data to the image processing section 123, which will be described later. The image sensor 122 may further output frame sync signals to the drive circuit 22. Consequently, the drive circuit 22 can allow the light emitting elements 321 in the light emitting section 32 to emit light at a timing corresponding to a frame cycle of the image sensor 122.

The image processing section 123 may be constituted of various image processing processors such as a digital signal processor (DSP). The image processing section 123 performs various types of image signal processing to digital signals (image signals) input from the image sensor 122, for example.

The control section 130 may be constituted of various types of information processing apparatuses such as a microcomputer including a central processing unit (CPU), a read only memory (ROM), and a random access memory (RAM), and an information processing apparatus such as a DSP. The control section 130 performs control of the drive circuit 22 so as to control light-emitting operation with the light emitting section 32 and control according to imaging operation with the image sensor 122.

The control section 130 may include a function serving as the distance measuring section 131. The distance measuring section 131 measures a distance to the subject S based on image signals input via the image processing section 123 (specifically, image signals provided by the receiving of the reflected light from the subject S).

The distance measuring section 131 measures the subject S so as to be able to determine a three-dimensional shape thereof by measuring distances to respective portions of the subject S. In some cases, the control section 130 has a configuration in which control to the power supply circuit 111 is performed.

The following describes a specific method for distance measurement with the distance measuring apparatus 100. Examples of distance measurement adopted with the distance measuring apparatus 100 can include a structured light (STL) method and a time-of-flight (ToF) method.

The STL method is a method for measuring a distance based on images obtained by imaging the subject S irradiated with light having a certain bright/dark pattern such as a dot pattern, a lattice pattern, and the like.

For the STL method, light having a dot pattern is incident on the subject S. This pattern light is divided into a plurality of blocks and each of the blocks has a different dot pattern assigned thereto so that dot patterns will not overlap among the blocks. With the STL method adopted, the light emitting section 32 functions as a light source of the STL.

The ToF method is a method for measuring a distance to a target by detecting a flight time (time lag) of the light that the light emitting section 32 has emitted, until the light reaches the image sensor 122 after being reflected on the target.

When the ToF method uses what is called a direct ToF, the image sensor 122 uses a single photon avalanche diode (SPAD), and pulse drive is performed for the light emitting section 32.

In this case, the distance measuring section 131 calculates a time lag after light is emitted from the light emitting section 32 until the light is received by the image sensor 122 based on image signals input via the image processing section 123, and calculates distances to respective portions of the subject S based on the time lag and the light speed.

It should be noted that when the ToF method uses what is called an indirect ToF method (phase difference method), the image sensor 7 uses an infrared ray (IR) image sensor, for example. When the ToF method is adopted, the light emitting section 32 functions as a light source of the ToF sensor.

Figure 5:
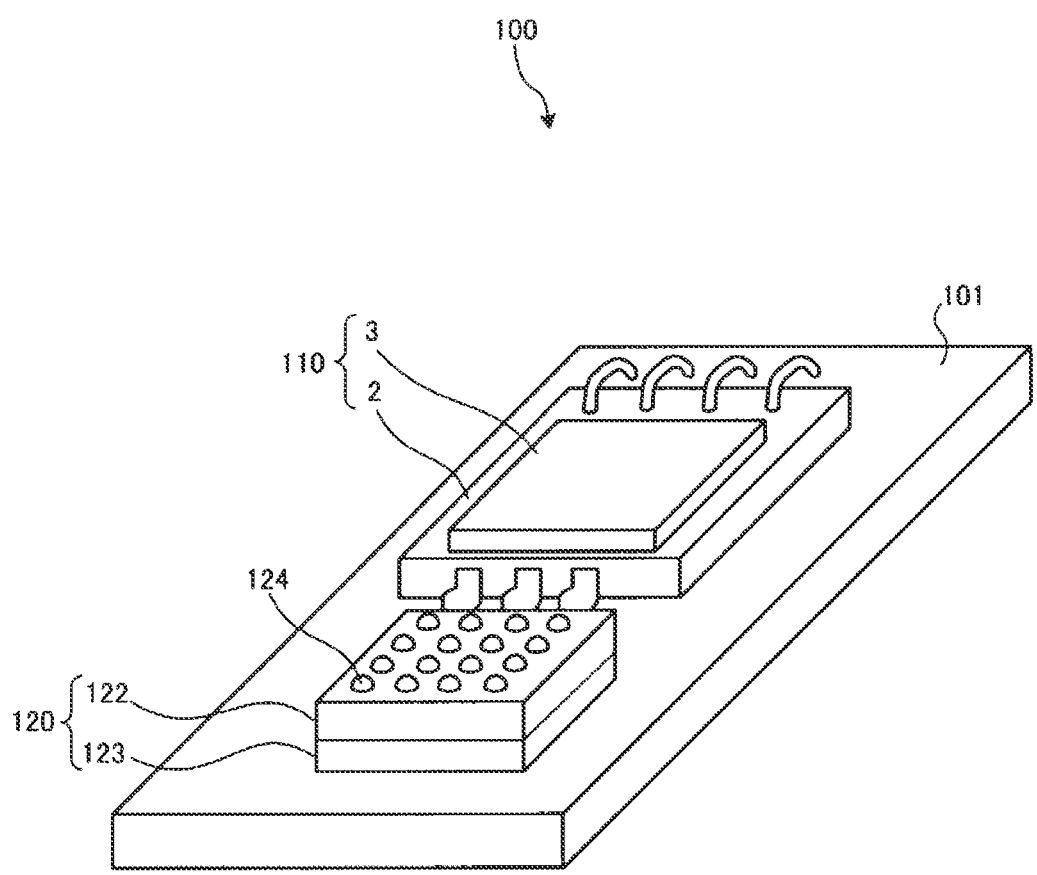
FIG. 5 is a diagram for explaining an example of arrangement of constituent elements of the measuring apparatus according to the present disclosure.

Next, with reference to FIG. 5, an example of arrangement of the constituent elements in the distance measuring apparatus 100 according to the embodiment will be described. FIG. 5 is a diagram for explaining an example of arrangement of the constituent elements in the distance measuring apparatus 100 according to the embodiment.

As illustrated in FIG. 5, the distance measuring apparatus 100 has the light source apparatus 110 and the imaging apparatus 120 mounted on the same plane of a mount substrate 101. It should be noted that in FIG. 5, illustration of the control section 130 is omitted. The imaging apparatus 120 includes the image sensor 122 having a plurality of imaging elements 124 arranged thereon and the image processing section 123, the image sensor 122 being stacked on the image processing section 123.

The light source apparatus 110 includes the chip 3 having therein the light emitting section 32 and the semiconductor substrate 2 including the drive circuit 22, in which the chip 3 is mounted on the semiconductor substrate 2 by flip chip mounting. The semiconductor substrate 2 and the chip 3 thus constitute a layered structure.

This configuration can reduce the area that the light source apparatus 110 occupies in the mount substrate 101 comparing with a case where the semiconductor substrate 2 and the chip 3 are mounted side by side on the same plane, so as to allow downsizing of the light source apparatus 110.

It should be noted that the light source apparatus 110 may have a configuration in which the chip 3 including the light emitting section 32 is mounted by flip chip mounting on a semiconductor substrate provided with a temperature sensor, and the semiconductor substrate 2 including the drive circuit 22 is mounted on the same plane as that for the semiconductor substrate 2 on the mount substrate 101.

In a case with this configuration described above, the temperature sensor detects temperatures near the light emitting section 32. The drive circuit 22 provides drive control to the light emitting section 32 according to the temperatures near the light emitting section 32 detected with the temperature sensor. With this configuration, the drive circuit 22 can prevent a change in the light-emitting characteristics of the light emitting section 32 due to a change in the temperatures.

The semiconductor substrate 2 and the chip 3 may be connected with each other with the bumps 4 including, for example, the above-described porous metal layers 41 made of Au. With this configuration, the semiconductor substrate 2 and the chip 3 can connect under the condition of comparatively low temperature and low pressure, so as to be less damaged by heat.

In a case where the semiconductor substrate 2 is made of silicon and the base material made of GaAs is used for the chip 3, even if the chip 3 is heated and swells with a coefficient of thermal expansion different from that of the semiconductor substrate 2, the porous metal layers 41 is elastically deformed, so as to prevent open fault from occurring in the bumps 4.

On the light source apparatus 110, the chip 3 is mounted by flip chip mounting on the semiconductor substrate 2 with the bumps 4 including, for example, the porous metal layers 41 made of Au. This configuration allows faster light emitting comparing with a case where the semiconductor substrate 2 and the chip 3 are mounted side by side on the same plane. Consequently, the distance measuring section 131 is able to improve in the distance measurement accuracy. Next, with reference to FIGS. 6 and 7, the faster light emitting and the improvement in the distance measurement accuracy will be explained.

Figure 6:
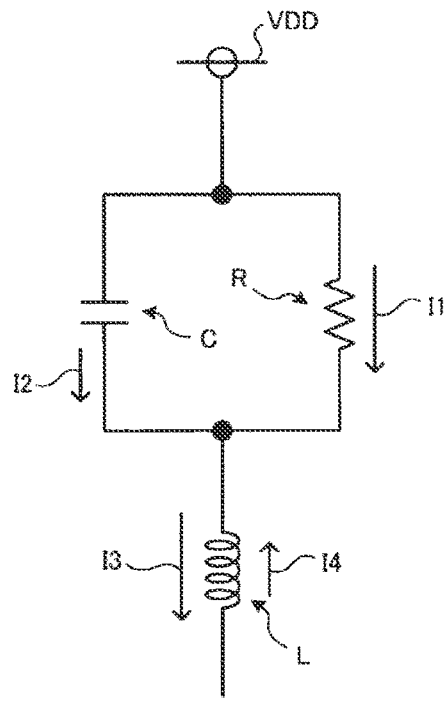
FIG. 6 is a circuit diagram illustrating an equivalent model of a drive circuit according to the present disclosure.
Figure 7:
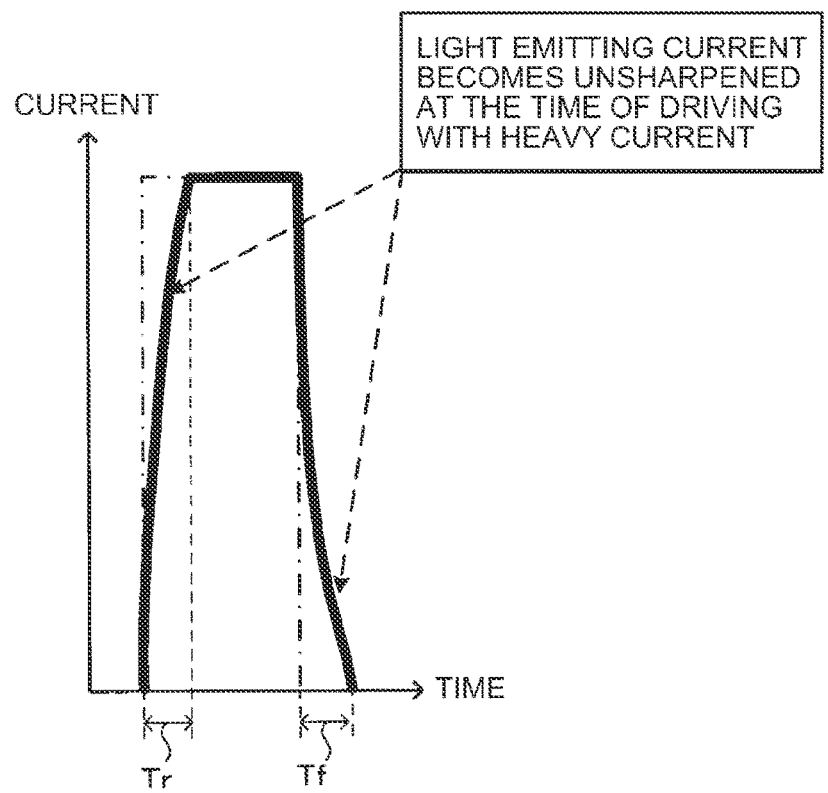
FIG. 7 is a diagram for explaining a rise time and a fall time of current flowing in a light emitting element according to the present disclosure.

FIG. 6 is a circuit diagram illustrating an equivalent model of the drive circuit 22 according to the embodiment. FIG. 7 is a diagram for explaining a rise time and a fall time of the current flowing in the light emitting elements 321 according to the embodiment. As illustrated in FIG. 6, the drive circuit 22 causes a light emitting current I1, which is heavy current, to flow in the light emitting elements 321 serving as an active resistor R, so as to allow the light emitting elements 321 in which the current flows to emit light.

At that time, a shunt current I2 flows in a parasitic capacitor C of the bumps 4 connecting the drive circuit 22 and the light emitting section 32, and while a drive current I3 flows in a parasitic inductance L, a reverse electromotive current I4 flows in the parasitic inductance L.

Accordingly, as illustrated in FIG. 7 with dashed lines, while it is ideal for the current flowing in the light emitting elements 321 to rise instantly and fall instantly, actually as illustrated with bold solid lines, the light emitting current I1 becomes unsharpened under influence of the reverse electromotive current I4 at the time of driving with the heavy current.

Consequently, the rise time (Tr) and the fall time (Tf) of the light emitting current I1 flowing in the light emitting elements 321 increase. This rise time Tr and the fall time Tf become longer as a connecting wire with which the drive circuit 22 and the light emitting section 32 are connected becomes longer.

Thus, in a light source apparatus with the semiconductor substrate 2 and the chip 3 being mounted side by side on the same plane, the drive circuit 22 inside the semiconductor substrate 2 and the light emitting section 32 inside the chip 3 are connected with a long bonding wire, so that the rise time Tr and the fall time Tf are long.

In contrast, in the light source apparatus 110 according to the embodiments, the drive circuit 22 and the light emitting section 32 are connected with the bumps 4, which are shorter than a bonding wire, so that the rise time Tr and the fall time Tf can be prevented from increasing. Therefore, the light source apparatus 110 can provide faster light emitting comparing with the light source apparatus in which the semiconductor substrate 2 and the chip 3 are mounted side by side on the same plane.

Furthermore, the distance measuring section 131 has, in the light source apparatus in which the semiconductor substrate 2 and the chip 3 are mounted side by side on the same plane, a longer rise time Tr, so as to decrease the distance measurement accuracy in some cases. For example, when the distance measuring apparatus 100 is a ToF sensor, the distance measuring section 131 measures a distance to the subject S based on a time from a timing at which the luminance of light emitted from the light emitting elements 321 reaches a peak until a timing at which the luminance of the light received by the image sensor 122 reaches a peak.

At that time, as described above, the light source apparatus in which the semiconductor substrate 2 and the chip 3 are mounted side by side on the same plane has a longer rise time Tr. In accordance with this, the luminance of light emitted from the light emitting elements 321 is slowly increasing, so that the luminance of the light received by the image sensor 122 is slowly increasing.

As a result, the distance measuring section 131 incorrectly determines that the luminance of light received by the image sensor 122 has reached a peak before the luminance of the light reaches an original peak, and measures a distance to the subject S to be shorter than the actual distance, which results in decrease in distance measurement accuracy.

In contrast, the light source apparatus 110 according to the embodiments allows faster light emitting, and thus the luminance of light emitted from the light emitting elements 321 is able to sharply increase. Thus, the luminance of the light received by the image sensor 122 sharply increases.

Thus, the distance measuring section 131 further accurately determines a timing at which the luminance of the light received by the image sensor 122 reaches an original peak, so as to be able to correctly measure a distance to the subject S, which results in increase in distance measurement accuracy.

Next, with reference to FIG. 8, an example of the cross section structure of the light source apparatus 110 will be described. FIG. 8 is a diagram for explaining the cross section structure of the light source apparatus 110 according to the embodiment. As illustrated in FIG. 8, the light source apparatus 110 has a configuration in which the chip 3 is mounted by flip chip mounting on the semiconductor substrate 2, for example made of Si, having the drive circuit 22 formed therein (refer to FIG. 1).

The chip 3 may include a GaAs substrate 141, for example, the surface of which having a plurality of light emitting elements 321 formed thereon (lower surface in FIG. 8). The light emitting elements 321 each serve as a cathode on the GaAs substrate 141 side, and each serve as an anode on the semiconductor substrate 2 side, the cathodes being connected with one another. It should be noted that the light emitting elements 321 may each serve as an anode on the GaAs substrate 141 side, and may each serve as a cathode on the semiconductor substrate 2 side, the anodes being connected with one another in this case.

The light emitting elements 321 each have an electrode 142 serving as anode and an electrode 143 serving as cathode that are provided side by side on the same plane. The light emitting elements 321 emit light when the current flows from the electrode 142 serving as anode to the electrode 143 serving as cathode. As illustrated in FIG. 8 with outlined arrows, the light emitting elements 321 emit laser light in a direction from the top surface (lower surface) to the bottom surface (upper surface) of the exemplary GaAs substrate 141.

The semiconductor substrate 2 is provided with a plurality of connection pads 150 on a surface of a side facing the chip 3. Each of the connection pads 150 may be arranged on a corresponding position opposing the electrode 142 serving as anode and the electrode 143 serving as cathode of a chip laminated.

The connection pad 150, the electrode 142 serving as anode, and the electrode 143 serving as cathode are connected with one another with the bump 4 that may include the porous metal layer 41 of Au. The connection pad 150 connected with the electrode 143 serving as cathode may be grounded (unillustrated) via a wiring 151.

Each of the connection pads 150 connecting with each electrode 142 serving as anode may be connected with an end of a corresponding switch 154 with a corresponding wire 152 and a corresponding pad 153 interposed between the end of the switch 154 and the connection pad 150. The other end of the switch 154 may be connected to a current supply source that supplies the light emitting current I1. It should be noted that in a case where the electrode 142 serves as cathode and the electrode 143 serves as anode, the switch 154 is connected with a corresponding electrode serving as cathode.

A plurality of the switches 154 may be each controlled by the drive circuit 22 individually. Consequently, the drive circuit 22 is able to control the light emitting elements 321 individually in an independent manner. As a result, the light source apparatus 110 can irradiate the subject S with pattern light having various types of dot patterns when the distance measuring apparatus 100 performs distance measurement with the STL method. It should be noted that each switch 154 may be shared with the light emitting elements 321 and controlled by a corresponding group of a certain number of the light emitting elements 321.

Figure 9A:
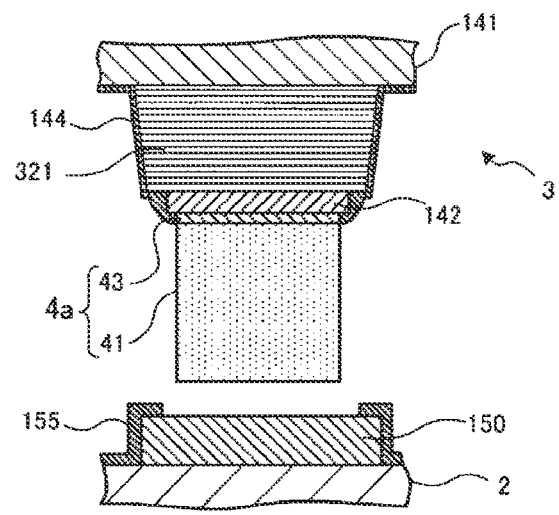
FIG. 9A is a diagram for explaining an assembly process of the light source apparatus according to the present disclosure.
Figure 9B:
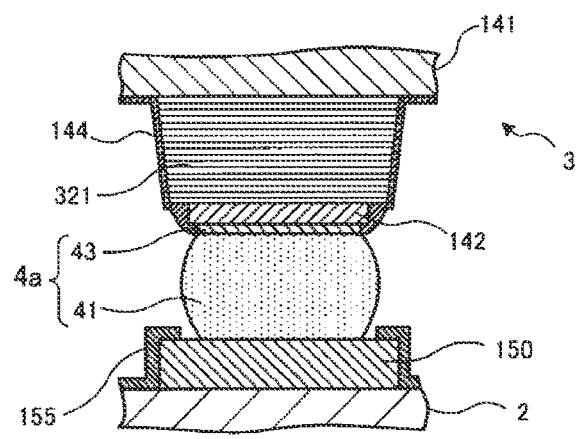
FIG. 9B is a diagram for explaining an assembly process of the light source apparatus according to the present disclosure.
Figure 9C:
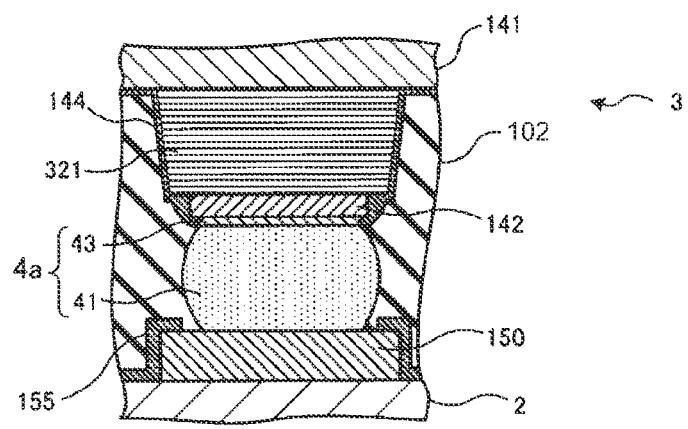
FIG. 9C is a diagram for explaining an assembly process of the light source apparatus according to the present disclosure.

Next, with reference to FIGS. 9A to 9C, procedures of assembling the light source apparatus 110 will be explained. FIGS. 9A to 9C are diagrams for explaining procedures of assembling the light source apparatus 110 according to the embodiment. The following explains a process of connecting the chip 3 and the semiconductor substrate 2.

Among the constituent elements of FIGS. 9A to 9C, those having the same configuration as that of the constituent elements illustrated in FIG. 8 are provided with the same numerals as indicated in FIG. 8, so that overlapping descriptions will be omitted. It should be noted that while here described is a case where the electrode 142 serving as anode side of the light emitting elements 321 is provided with the bump 4a (refer to FIG. 3D), the connection pad 150 side of the semiconductor substrate 2 may be provided with the bump 4 (refer to 2D).

As illustrated in FIG. 9A, when the bump 4a is mounted on the electrode 142 serving as anode side, which is the chip 3 side, of the light emitting elements 321, for example, the metal films 43 made of Au may be disposed between the porous metal layers 41 containing Au and the electrode 142 serving as anode.

The metal films 43 may be formed such that the ratio of the film thicknesses of the metal films 43 to the heights of the bumps 4a is set to be less than 10%, preferably less than 5%. For example, the metal films 43 are formed, when the porous metal layers 41 the height (thickness) of which is 10 μm are formed, so as to have a thickness of 0.2 μm.

Furthermore, when the connection pad 150 side of the semiconductor substrate 2 is provided with the bump 4 (refer to FIG. 2D), the metal films 42 may be formed such that the ratio of the film thicknesses of the metal films 42 to the heights of the bumps 4 is set to be less than 10%, preferably less than 5%. For example, the metal films 42 are formed, when the porous metal layers 41 the height (thickness) of which is 10 μm are formed, so as to have a thickness of 0.2 μm.

The metal films 43 described above may be formed so as to provide more rigidity to the fine structure of the photoresist layer 52 (refer to FIG. 3B) in which the chip 3 has patterning to form the bump 4a. With this configuration, it is possible to achieve fine pitch of the bump 4a, the thickness of which is approximately 10 μm, such that the pitch is set to be 20 μm or smaller.

While part of the description is made assuming that the component of the connection pad 150 on the semiconductor substrate 2 side is Au, which is similar to the porous metal layers 41, when the component of the connection pad 150 is other than Au, the surface of the connection pad 150 is provided with a film made of Au, the film having the same component as that of the porous metal layers 41. With this configuration, it is possible to increase the connection strength between the connection pad 150 and the porous metal layers 41.

When the chip 3 and the semiconductor substrate 2 are to be connected, as illustrated in FIG. 9A, first, the chip 3 may be mounted on the semiconductor substrate 2 so as to align the connection pad 150 mounted on the upper surface of the semiconductor substrate 2 with the bump 4a mounted on the electrode 142 serving as anode on the chip 3 side.

Subsequently, as illustrated in FIG. 9B, the chip 3 may be lowered to abut the lower surface of the bump 4a on the upper surface of the connection pad 150 to apply a certain pressure thereto. After that, the chip 3 may be heated to a comparatively lower temperature of approximately 100° C., and the connection pad 150 and the electrode 142 serving as anode are connected with the bump 4a without melting the porous metal layers 41 made of Au in the bump 4a.

At that time, the porous metal layers 41 may be slightly crushed in the thickness direction according to the temperature elevated and the pressure applied thereto, and decreases in the height (thickness) thereof. As a result, in a state after the chip 3 and the semiconductor substrate 2 are connected with the bump 4a, the metal films 43 are such that the ratio of the film thicknesses of the metal films 43 to the heights of the bumps 4a is set to be less than 20%.

Similarly, when the bump 4 is mounted on the connection pad 150 side of the semiconductor substrate 2 (refer to FIG. 2D), in a state after the chip 3 and the semiconductor substrate 2 are connected with the bump 4, the metal films 42 may be such that the ratio of the film thicknesses of the metal films 42 to the heights of the bumps 4 is less than 20%.

The side surface of the light emitting elements 321 mounted on the chip 3 and the side surface and the periphery of the lower surface of the electrode 142 serving as anode mounted on the anode of the light emitting elements 321 may be covered with an insulating film 144. The insulating film 144 may include at least one of silicon dioxide ($SiO_2$) and silicon nitride (SiN), for example.

The side surface and the periphery of the upper surface of the connection pad 150 mounted on the upper surface of the semiconductor substrate 2 may be covered with an insulating film 155. The insulating film 155 may include at least one of $SiO_2$ and SiN, for example. A portion not covered with the insulating film 155 on the upper surface of the connection pad 150, in other words, a dimeter of the upper opening of the insulating film 155 may be formed larger than the diameter of the bump 4a.

With this configuration, it is possible to certainly connect the connection pad 150 and the electrode 142 serving as anode of the light emitting elements 321 with the bump 4a even if there is some difference in the position between the connection pad 150 and the bump 4a.

After that, as illustrated in FIG. 9C, with insulating resin 102 being filled between the semiconductor substrate 2 and the chip 3 and between the connection parts for connecting the semiconductor substrate 2 and the chip 3, insulation between the adjacent bumps 4a is established and the assembling of the light source apparatus 110 is completed.

With this configuration, the light source apparatus 110 can have the adjacent bumps 4a insulated from each other with the insulating resin 102, so as to prevent short circuit failure between the bumps 4a and open fault of the bumps 4a due to impulsive force.

3. Effects

The electronic device 1 includes the semiconductor substrate 2, the chip 3, and the connection parts (exemplified as the bumps 4). The chip 3 may have a different thermal expansion rate from a thermal expansion rate of the semiconductor substrate 2. The bumps 4 may include the porous metal layers 41 for connecting the connection pads 21 and 31 that are arranged on opposing principle surfaces of the semiconductor substrate 2 and the chip 3.

With this configuration, the electronic device 1 is able to connect the connection pads 21 and 31 of the semiconductor substrate 2 and the chip 3 by a process at lower temperature and lower pressure as compare to a case where the connection pads 21 and 31 of the semiconductor substrate 2 and the chip 3 are connected by a metal bump in a bulk state. Therefore, the electronic device 100 is able to reduce damage due to high temperature and high pressure, so that it is possible to improve the reliability.

Furthermore, a difference between the thermal expansion rates of the chip 3 and the semiconductor substrate 2 may be 0.1 ppm/° C. or greater, for example. Therefore, for example, even when the chip 3 generates heat and expands at the different thermal expansion rate from that of the semiconductor substrate 2, because the porous metal layers 41 are elastically deformed, the electronic device 1 is able to prevent occurrence of an open fault at the bumps 4.

Moreover, the chip 3 is a semiconductor laser, and the semiconductor substrate 2 includes the drive circuit 22 that drives the semiconductor laser. Therefore, even when the chip 3 expands at the different thermal expansion rate from that of the semiconductor substrate 2 due to heat generated by light emission of the semiconductor laser, because the porous metal layers 41 are elastically deformed, the electronic device 1 is able to prevent occurrence of an open fault at the bumps 4.

The chip 3 may be or may include a semiconductor laser. The semiconductor substrate may include a temperature sensor. With this configuration, the drive circuit 22, which drives the semiconductor laser, provides drive control to the light emitting section 32 according to temperatures near the light emitting section 32 detected with the temperature sensor, so as to be able to prevent a change in the light-emitting characteristics of the light emitting section 32 due to a change in the temperature.

The semiconductor laser includes the light emitting elements 321. The light emitting elements 321 may be two-dimensionally arrayed, each of which emits laser light. The light emitting elements 321 may have the electrode 142 serving as anode and the electrode 143 serving as cathode provided on the same plane. With this configuration, the semiconductor laser can easily connect with the drive circuit 22.

The semiconductor substrate 2 may include the switches 154. The switches 154 connect with the corresponding electrode 142 serving as anode or the corresponding electrode 143 serving as cathode. Consequently, the drive circuit 22 can irradiate the subject S with pattern light having various types of dot patterns by controlling each of the switches 154 individually, when the distance measuring apparatus 100 performs distance measurement with the STL method.

The switches 154 are each connected with a corresponding group of the light emitting elements 321. The light emitting elements 321 are subjected to light emission control for each group. Consequently, the distance measuring apparatus 100 can irradiate the subject S with pattern light having various types of patterns by changing light emission patterns for each group of the light emitting elements 321, for example.

Moreover, the switches 154 are connected to the corresponding light emitting elements 321. The light emitting elements 321 are each subjected to light emission control individually. Consequently, the distance measuring apparatus 100 can irradiate the subject S with pattern light having any desired light emission pattern.

The light emitting elements 321 may be formed on a common substrate. With this configuration, for the semiconductor laser, the light emitting elements 321 can share one electrode 142 serving as anode or electrode 143 serving as cathode.

Each of the electrode 142 serving as anode or the electrode 143 serving as cathode and each of the switches 154 are connected with the corresponding connection part (bump 4). With this configuration, the light source apparatus 110 is able to connect the semiconductor substrate 2 and the chip 3 by a process at lower temperature and lower pressure as compare with a case where the semiconductor substrate 2 and the chip 3 are connected by a metal bump in a bulk state. Therefore, the light source apparatus 110 is able to reduce damage due to high temperatures and high pressures, so that it is possible to improve the reliability.

The light emitting elements 321 may have a VCSEL structure. With this structure, the light source apparatus 110 can reduce the power consumption thereof, thereby enabling mass production.

The insulating resin 102 may be filled between the semiconductor substrate 2 and the chip 3 and between the connection parts (bumps 4). With this configuration, the light source apparatus 110 can have the adjacent bumps 4 insulated from each other with the insulating resin 102, so as to prevent short circuit failure between the bumps 4 and open fault of the bumps 4 due to impulsive force.

Furthermore, the porous metal layers 41 may include the metal particles with the particle diameters of 0.005 μm to 1.0 μm. The porous metal layers 41 as described above are able to bond metals at lower temperature than a melting point of a bulk-state metal due to a size effect of the particle diameters. Therefore, the connection pads 21 and 31 of the semiconductor substrate 2 and the chip 3 can be connected by the porous metal layers 41 that enable metal bonding at relatively low temperature, so that the electronic device 1 is able to reduce damage due to heat and improve the reliability.

Moreover, the bumps 4 may include the metal films 42 and 43 having the same component as that of the porous metal layers 41 at least between the porous metal layers 41 and the connection pads 21 on the semiconductor substrate 2 side or between the porous metal layers 41 and the connection pads 31 on the chip 3 side.

Therefore, even when the components of the connection pads 21 and 31 and the component of the porous metal layers 41 are different, it is possible to firmly connect the connection pads 21 and 31 using the metal films 42 and 43 and the porous metal layers 41.

Furthermore, the metal films 42 and 43 may be thin films that are formed to harden the surfaces of the patterned photoresist layers 51 and 52 used in the process of forming the bumps 4 and 4a. Therefore, it is possible to form the bumps 4 and 4a with fine structures, so that it is possible to realize fine pitch of the bumps 4 and 4a.

Moreover, the metal films 42 may be formed such that the ratio of the film thicknesses of the metal films 42 to the heights of the bumps 4 in the direction perpendicular to the principle surface of the semiconductor substrate 2 is set to be less than 10%, preferably less than 5%. Furthermore, the metal films 43 are formed such that the ratio of the film thicknesses of the metal films 43 to the heights of the bumps 4a in the direction perpendicular to the principle surface of the chip 3 is set to be less than 10% or smaller, preferably less than 5%.

Therefore, it is possible to prevent the through holes that are patterned on the photoresist layers 51 and 52 for forming the bumps 4 and 4a from narrowing down due to formation of the metal films 42 and 43. As a result, it is possible to appropriately fill the thorough holes patterned on the photoresist layers 51 and 52 with the paste 40 that includes the metal particles as the material of the bumps 4 and 4a.

Moreover, in the electronic device in which the semiconductor substrate 2 and the chip 3 are connected by the bumps 4 and the bumps 4a, the metal films 42 and 43 may be formed such that the ratio of the film thicknesses to halves of the thicknesses of the laminated bodies of the bumps 4 and 4a in the direction perpendicular to the principle surface of the semiconductor substrate 2 and the chip 3 are set to be 10% or smaller, preferably less than 5%.

Therefore, it is possible to prevent the through holes that are patterned on the photoresist layers 51 and 52 for forming the bumps 4 and 4a from narrowing down due to formation of the metal films 42 and 43. As a result, it is possible to appropriately fill the thorough holes patterned on the photoresist layers 51 and 52 with the paste 40 that includes the metal particles as the material of the bumps 4 and 4a.

Furthermore, the electronic device 1 includes the semiconductor substrate 2 and the bumps 4. The bumps 4 may include the metal films 42 and the porous metal layers 41 that are sequentially deposited on the surfaces of the connection pads 21 that are arranged on the principle surface of the semiconductor substrate 2. For example, the metal films 42 may be formed such that the ratio of the film thicknesses to the thicknesses of the bumps 4 in the direction perpendicular to the principle surface of the semiconductor substrate 2 is set to be 10% or smaller.

Therefore, the semiconductor substrate 2 is able to realize fine pitch of the bumps 4 and realize flip chip mounting of the chip 3 having a different thermal expansion rate from that of the semiconductor substrate 2 through a process at lower temperature and lower pressure as compared to a case where a bump made of a metal in a bulk state is used.

The semiconductor substrate 2 may include the drive circuit 22 that drives the semiconductor laser mounted on the semiconductor substrate 2 by flip chip mounting, for example. The drive circuit 22 is able to control the light emitting elements included in the semiconductor laser in an independent manner by controlling the switches 154 connecting the respective electrodes 142 serving as anode in the light emitting elements 321 and the current supply source. With this configuration, the drive circuit 22 can irradiate the subject S with pattern light having various types of dot patterns with the light source apparatus 110 when the distance measuring apparatus 100 performs distance measurement with the STL method.

Moreover, the electronic device 1 includes the chip 3 and the bumps 4a. The bumps 4a may include the metal films 43 and the porous metal layers 41 that are sequentially deposited on the connection pads 31 that are arranged on the principle surface of the chip 3. The metal films 43 may be formed such that the ratio of the film thicknesses to the thicknesses of the bumps 4a in the direction perpendicular to the principle surface of the chip 3 is set to be 10% or smaller.

Therefore, the chip 3 is able to realize fine pitch of the bumps 4a and realize flip chip mounting with respect to the semiconductor substrate 2 having a different thermal expansion rate from that of the chip 3 through a process at lower temperature and lower pressure as compared to a case where a bump made of a metal in a bulk state is used.

The chip 3 may be the semiconductor laser. The semiconductor laser includes the light emitting elements 321. The light emitting elements 321 may be two-dimensionally arrayed, each of which emits laser light. The light emitting elements 321 may each have the electrode 142 serving as anode and the electrode 143 serving as cathode mounted on the same plane. With this configuration, the semiconductor laser can easily connect with the drive circuit 22.

The chip 3 can be bonded on the drive circuit 22 with the bumps 4 disposed therebetween, so that the area of the mount substrate 101 can be reduced.

The effects described in this specification are merely illustrative or exemplary and not limiting. That is, other effects may be achieved.

The following configurations are also within the technical scope of the present disclosure.

(1) An electronic device including:
  a semiconductor substrate;
  a chip having a different thermal expansion rate from a thermal expansion rate of the semiconductor substrate; and
  a connection part including a porous metal layer for connecting connection pads that are arranged on opposing principle surfaces of the semiconductor substrate and the chip.

(2) The electronic device according to the above-mentioned (1), wherein a difference between the thermal expansion rates of the chip and the semiconductor substrate is 0.1 ppm/° C. or greater.

(3) The electronic device according to the above-mentioned (1) or (2), wherein
  the chip is a semiconductor laser, and
  the semiconductor substrate includes a drive circuit that drives the semiconductor laser, (4) The electronic device according to the above-mentioned (1) to (3), wherein
  the chip is a semiconductor laser, and
  the semiconductor substrate includes a temperature sensor.

(5) The electronic device according to the above-mentioned (3) or (4), wherein
  the semiconductor laser includes a plurality of light emitting elements two-dimensionally arrayed, each of which emits laser light, and
  the light emitting elements each have an electrode serving as anode and an electrode serving as cathode provided on a same plane.

(6) The electronic device according to the above-mentioned (5), wherein
  the semiconductor substrate includes a switch, and
  the switch is connected with the electrode serving as anode or the electrode serving as cathode.

(7) The electronic device according to the above-mentioned (6), wherein
  the switch is connected with a corresponding group of the light emitting elements, and
  the light emitting elements are subjected to light emission control for the corresponding group.

(8) The electronic device according to the above-mentioned (6), wherein
  a plurality of the switches are connected with the respective light emitting elements, and
  the light emitting elements are subjected to light emission control individually.

(9) The electronic device according to any one of the above mentioned (6) to (8), wherein each of the electrodes serving as anode or each of the electrodes serving as cathode and each of the switches are connected with the connection part.

(10) The electronic device according to any one of the above mentioned (5) to (9), wherein the light emitting elements are formed on a common substrate.

(11) The electronic device according to any one of the above mentioned (5) to (10), wherein the light emitting elements have a vertical cavity surface emitting laser (VCSEL) structure.

(12) The electronic device according to any one of the above mentioned (1) to (11), wherein insulating resin is filled between the semiconductor substrate and the chip and between the connection parts.

(13) The electronic device according to any one of the above mentioned (1) to (12), wherein the porous metal layer includes a metal particle with a particle diameter of 0.005 μm to 1.0 μm.

(14) The electronic device according to any one of the above mentioned (1) to (13), wherein
the connection part includes a metal film having a same component as a component of the porous metal layer at least between the porous metal layer and the connection pad on the semiconductor substrate side or between the porous metal layer and the connection pad on the chip side.

(15) The electronic device according to the above-mentioned (14), wherein the metal film is formed such that a ratio of a film thickness to a thickness of the connection part in a direction perpendicular to the principle surface is set to be 10% or smaller.

(16) The electronic device according to the above-mentioned (15), wherein the metal film is formed such that the ratio of the film thickness to the thickness of the connection part in the direction perpendicular to the principle surface is set to be less than 5%.

(17) The electronic device according to above-mentioned (14), wherein the metal film is formed such that a ratio of a film thickness to a half of a thickness of the connection part in a direction perpendicular to the principle surface is set to be 10% or smaller.

(18) The electronic device according to above-mentioned (17), wherein the metal film is formed such that the ratio of the film thickness to a half of the thickness of the connection part in the direction perpendicular to the principle surface is set to be less than 5%.

(19) The electronic device according to any of the above-mentioned (1) to (18), wherein a height ratio between the porous metal layer and the connection part in the direction perpendicular to the principle surface is larger than 90%.

(20) An electronic device including:
a semiconductor substrate; and
a bump including a metal film and a porous metal layer that are sequentially deposited on a surfaces of a connection pad that is arranged on a principle surface of the semiconductor substrate, wherein
the metal film is formed such that a ratio of a film thickness to a thickness of the bump in a direction perpendicular to the principle surface is set to be 10% or smaller.

(21) The electronic device according to above-mentioned (20), wherein
the semiconductor substrate includes a drive circuit that drives the semiconductor laser mounted on the semiconductor substrate by flip chip mounting, and
the drive circuit controls a plurality of light emitting elements included in the semiconductor laser in an independent manner by controlling switches correspondingly connecting the light emitting elements and a current supply source.

(22) An electronic device including:
a chip; and
a bump including a metal film and a porous metal layer that are sequentially deposited on a surfaces of a connection pad that is arranged on a principle surface of the chip, wherein
the metal film is formed such that a ratio of a film thickness to a thickness of the bump in a direction perpendicular to the principle surface is set to be 10% or smaller.

(23) The electronic device according to above-mentioned (22), wherein
the chip is a semiconductor laser,
the semiconductor laser includes a plurality of light emitting elements two-dimensionally arrayed, each of which emits laser light, and
the light emitting elements each have an electrode serving as anode and an electrode serving as cathode provided on a same plane.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth. The aspects and features mentioned and described above together with one or more of the previously described examples and figures, may as well be combined with one or more of the other examples in order to replace a like feature of the other example or in order to additionally introduce the feature to the other example. For example, structural and/or functional details provided in the detailed description above may likewise apply to electronic devices configured as described with reference to configurations (19) to (23).

What is claimed is:

1. An electronic device, comprising:
a semiconductor substrate;
a chip, wherein the chip includes a plurality of light emitting elements and a chip substrate having a different thermal expansion rate from a thermal expansion rate of the semiconductor substrate, wherein the plurality of light emitting elements are between the chip substrate and the semiconductor substrate, and wherein the plurality of light emitting elements each have an anode electrode and a cathode electrode on a same plane; and
a connection part including a porous metal layer for connecting connection pads that are arranged on opposing surfaces of the semiconductor substrate and the chip.

2. The electronic device according to claim 1, wherein a difference between the thermal expansion rates of the chip and the semiconductor substrate is 0.1 ppm/° C. or greater.

3. The electronic device according to claim 1, wherein
the chip is a semiconductor laser, and
the semiconductor substrate includes a drive circuit that drives the semiconductor laser.

4. The electronic device according to claim 1, wherein
the chip is a semiconductor laser, and
the semiconductor substrate includes a temperature sensor.

5. The electronic device according to claim 3, wherein the plurality of light emitting elements are two-dimensionally arrayed, each of which emits laser light.

6. The electronic device according to claim 5, wherein
the semiconductor substrate includes a switch, and
the switch is connected with the anode electrode or the cathode electrode.

7. The electronic device according to claim 6, wherein the switch is connected with a corresponding group of the plurality of light emitting elements, and the plurality of light emitting elements are subjected to light emission control for the corresponding group.

8. The electronic device according to claim 6, wherein a plurality of switches are connected with respective ones of the plurality of light emitting elements, and the plurality of light emitting elements are subjected to light emission control individually.

9. The electronic device according to claim 6, wherein the anode electrode or the cathode electrode and the switch are connected with the connection part.

10. The electronic device according to claim 5, wherein the plurality of light emitting elements are formed on the chip substrate.

11. The electronic device according to claim 5, wherein the plurality of light emitting elements have a vertical cavity surface emitting laser (VCSEL) structure.

12. The electronic device according to claim 1, wherein insulating resin is filled between the semiconductor substrate and the chip and between the connection part.

13. The electronic device according to claim 1, wherein the porous metal layer includes a metal particle with a particle diameter of 0.005 μm to 1.0 μm.

14. The electronic device according to claim 1, wherein the connection part includes a metal film having a same component as a component of the porous metal layer at least between the porous metal layer and the connection pads on the semiconductor substrate side or between the porous metal layer and the connection pads on the chip side.

15. The electronic device according to claim 14, wherein the metal film is formed such that a ratio of a film thickness to a thickness of the connection part in a direction perpendicular to a principle surface is set to be 10% or smaller.

16. The electronic device according to claim 15, wherein the metal film is formed such that the ratio of the film thickness to the thickness of the connection part in the direction perpendicular to the principle surface is set to be less than 5%.

17. The electronic device according to claim 14, wherein the metal film is formed such that a ratio of a film thickness to half of a thickness of the connection part in a direction perpendicular to a principle surface is set to be 10% or smaller.

18. The electronic device according to claim 17, wherein the metal film is formed such that the ratio of the film thickness to the half of the thickness of the connection part in the direction perpendicular to the principle surface is set to be less than 5%.

19. The electronic device according to claim 1, wherein a height ratio between the porous metal layer and the connection part in a direction perpendicular to a principle surface is larger than 90%.

20. An electronic device, comprising:
a semiconductor substrate;
a chip, wherein the chip includes a plurality of light emitting elements and a chip substrate having a different thermal expansion rate from a thermal expansion rate of the semiconductor substrate, wherein the plurality of light emitting elements are between the chip substrate and the semiconductor substrate, and wherein the plurality of light emitting elements each have an anode electrode and a cathode electrode on a same plane; and a bump including a metal film and a porous metal layer that are deposited on a surface of a connection pad on a surface of the semiconductor substrate, wherein a ratio of a film thickness of the metal film to a total thickness of the bump in a direction perpendicular to the surface of the semiconductor substrate is 10% or smaller.

21. The electronic device according to claim 20, wherein each of the plurality of light emitting elements is a semiconductor laser, wherein the semiconductor substrate includes a drive circuit that drives the semiconductor lasers, wherein the chip is mounted on the semiconductor substrate by flip chip mounting, and wherein the drive circuit controls the plurality of light emitting elements included in the chip in an independent manner by controlling switches correspondingly connecting the plurality of light emitting elements and a current supply source.

22. An electronic device, comprising:
a chip, the chip including:
a chip substrate, the chip substrate having a first surface and a second surface opposite the first surface; and
a plurality of light emitting elements, wherein the plurality of light emitting elements are disposed on the second surface of the chip substrate, wherein each of the plurality of light emitting elements is a semiconductor laser, wherein the plurality of light emitting elements each have an anode electrode and a cathode electrode on a same plane, and wherein the first surface of the chip substrate is a light emitting surface; and a bump including a metal film and a porous metal layer that are deposited on a surface of a connection pad on a surface of the chip, wherein a ratio of a film thickness of the metal film to a total thickness of the bump in a direction perpendicular to a surface of a semiconductor substrate is 10% or smaller.

23. The electronic device according to claim 22, wherein the semiconductor lasers of the plurality of light emitting elements are vertical cavity surface emitting lasers, and wherein the plurality of light emitting elements are two-dimensionally arrayed.

24. The electronic device according to claim 1, wherein the chip substrate is a different material than the semiconductor substrate.

25. The electronic device according to claim 24, wherein the chip substrate is GaAs.

26. The electronic device according to claim 25, wherein the semiconductor substrate is Si.

* * * * *